United States Patent
Bandoh et al.

(10) Patent No.: US 10,191,510 B1
(45) Date of Patent: Jan. 29, 2019

(54) CONNECTOR SUBSTRATE ASSEMBLY, ELECTRONIC DEVICE, AND METHOD FOR ASSEMBLING ELECTRONIC DEVICE

(71) Applicant: LENOVO (SINGAPORE) PTE. LTD., Singapore (SG)

(72) Inventors: Masaaki Bandoh, Yokohama (JP); Hiroaki Kinoshita, Yokohama (JP); Fumitake Mizoguchi, Yokohama (JP); Tomoo Yamada, Yokohama (JP); Osamu Ohsawa, Yokohama (JP); Koji Yamauchi, Yokohama (JP)

(73) Assignee: LENOVO (SINGAPORE) PTE. LTD., Singapore (SG)

( * ) Notice: Subject to any disclaimer, the term of this patent is extended or adjusted under 35 U.S.C. 154(b) by 0 days.

(21) Appl. No.: 15/783,384

(22) Filed: Oct. 13, 2017

(30) Foreign Application Priority Data

Aug. 18, 2017 (JP) .................................. 2017157966

(51) Int. Cl.
*G02B 6/38* (2006.01)
*G06F 1/16* (2006.01)
(Continued)

(52) U.S. Cl.
CPC ......... *G06F 1/1616* (2013.01); *G02B 6/3897* (2013.01); *G06F 1/185* (2013.01);
(Continued)

(58) Field of Classification Search
CPC .... H01R 13/741; H01R 13/74; H01R 13/743; H01R 12/7047; H01R 13/6658;
(Continued)

(56) References Cited

U.S. PATENT DOCUMENTS

| 4,352,538 A | * | 10/1982 | Fowler | H01R 4/245 439/404 |
| 4,647,129 A | * | 3/1987 | Kandybowski | H01R 13/629 439/246 |

(Continued)

FOREIGN PATENT DOCUMENTS

JP 2011082219 A 4/2011

*Primary Examiner* — Gary F Paumen
(74) *Attorney, Agent, or Firm* — Shimokaji IP

(57) ABSTRACT

A connector•substrate assembly can be disposed at a position where a tip portion of the connector is inserted into a connector hole simply and at a low cost without using an additional small substrate, an additional relay cable, and the like; an electronic device; and a method for assembling the same are provided. A connector is supported so as to be slidable with respect to a substrate, from a preparation position to a mounting position, and the tip of the connector projects outwardly from a right side of an end portion of the substrate at least at the mounting position. A chassis has a connector hole in the side surface. The connector does not interfere with a frame portion of the connector hole at the preparation position and the substrate can be properly attached to the chassis. The tip of the connector enters the connector hole at the mounting position. By slidably supporting the connector as described above, a small substrate, a relay cable, and the like become unnecessary, so that a reduction in the number of parts and simplification of an assembling process are achieved.

13 Claims, 12 Drawing Sheets

(51) Int. Cl.
*G06F 1/18* (2006.01)
*H05K 1/14* (2006.01)
*H05K 7/14* (2006.01)
*H01R 12/70* (2011.01)
*H01R 13/66* (2006.01)
*H01R 13/74* (2006.01)

(52) U.S. Cl.
CPC ..... *H01R 12/7047* (2013.01); *H01R 13/6658* (2013.01); *H01R 13/741* (2013.01); *H01R 13/748* (2013.01); *H05K 1/14* (2013.01); *H05K 7/14* (2013.01); *G02B 6/3879* (2013.01)

(58) Field of Classification Search
CPC ..... G06F 1/1616; G06F 1/185; G02B 6/3897; G02B 6/3879; H05K 1/14; H05K 7/14
USPC .................................. 439/79, 545, 547, 549
See application file for complete search history.

(56) References Cited

U.S. PATENT DOCUMENTS

| | | | | |
|---|---|---|---|---|
| 4,871,321 A | * | 10/1989 | Johnson | H01R 12/727 439/108 |
| 5,127,852 A | * | 7/1992 | Cravens | H01R 13/745 439/545 |
| 5,397,241 A | * | 3/1995 | Cox | H01R 24/50 439/63 |
| 5,707,241 A | * | 1/1998 | Hamlin | H01R 12/62 439/329 |
| 6,030,242 A | * | 2/2000 | Cunningham | H01R 13/6315 439/247 |
| 6,102,734 A | * | 8/2000 | Kuo | H01R 13/73 439/545 |
| 6,171,141 B1 | * | 1/2001 | Yasui | F16C 1/105 439/354 |
| 6,790,052 B2 | * | 9/2004 | Schmidgall | H01R 12/721 439/79 |
| 7,442,055 B2 | * | 10/2008 | Robinette | H01R 12/585 439/541.5 |
| 7,597,587 B1 | * | 10/2009 | Duesterhoeft | H01R 13/629 439/545 |
| 8,007,313 B2 | * | 8/2011 | Deno | H01R 13/748 439/545 |
| 2009/0117760 A1 | * | 5/2009 | Takahashi | H05K 1/119 439/79 |

* cited by examiner

CONNECTOR SUBSTRATE ASSEMBLY, ELECTRONIC DEVICE, AND METHOD FOR ASSEMBLING ELECTRONIC DEVICE

FIELD OF THE INVENTION

The present invention relates to a connector•substrate assembly having a substrate disposed in a chassis and a connector mounted on the substrate, an electronic device having the connector•substrate assembly in the chassis, and a method for assembling the electronic device.

BACKGROUND OF THE INVENTION

Recent personal computers have various functions and carry a large number of connectors according to the functions. A Laptop or tablet type personal computer is limited in space. Therefore, in order to carry a large number of types of connectors, the connectors are arranged so as to be distributed on both right and left sides.

The connector is disposed in such a manner that a tip portion thereof enters a connector hole provided in the side surface of a chassis, which is designed to facilitate the connection of a mating plug connector.

Moreover, in some recent Laptop PCs, the side surface is formed to be inclined so as to have a shape in which the upper surface side is slightly larger and the lower surface side is slightly narrower from the viewpoint of design. On the side surface having such an inclined shape, the connector needs to be disposed in such a manner as to slightly project so that a housing of the plug connector does not interfere with a frame portion of the connector hole, which tends to increase the insertion amount into the connector hole.

FIG. 2 of Patent Document 1 illustrates an example in which a tip portion of a connector is exposed to the side surface of a chassis.

[Patent Document 1] Japanese Patent Application Laid-Open No. 2011-082219

SUMMARY OF THE INVENTION

In a chassis of a Laptop PC, some connectors are mounted on one side of the largest main substrate. In assembling, the main substrate is inserted from an obliquely transverse direction so that the tips of the connectors are inserted into connector holes of one side surface of the chassis. Therefore, a connector provided on the other side surface of the chassis cannot be mounted on the main substrate. This is because the connector interferes with a frame portion of a connector hole in the other side surface of the chassis.

Then, as illustrated in FIG. 2 of Patent Document 1, the connector provided on the other side surface is mounted on a small substrate different from the main substrate, and then the small substrate and the main substrate are connected with a relay cable and a relay connector.

However, providing the small substrate, the relay cable, and the relay connector separately from the main substrate as described above increases the number of parts, and, in connection therewith, the number of assembling processes also increases, which causes a cost increase. Moreover, in order to dispose the small substrate and the relay cable, it is necessary to secure a certain degree of space, so that the space of the main substrate and the like is constrained within the secured space.

The present invention has been made in view of the above-described problems. It is an object of the present invention to provide a connector•substrate assembly which can be disposed at a position where a tip portion of the connector is inserted into a connector hole simply and at a low cost, an electronic device having the connector•substrate assembly in a chassis, and a method for assembling the electronic device.

In order to solve the above-described problems to achieve the object, a connector•substrate assembly according to a first aspect of the present invention has a connector and a substrate on which the connector is mounted, in which the connector is supported so as to be slidable with respect to the substrate from a preparation position to a mounting position and the connector partially projects outwardly from an end portion of the substrate at least at the mounting position.

Thus, by slidably supporting the connector, the connector can be disposed at the preparation position in attachment of the substrate to a chassis and the like and the connector can be slid to the mounting position after the attachment, which eliminates the necessity of a small substrate, a relay cable, and the like, so that a reduction in the number of parts and simplification of an assembling process is achieved.

A direction in which the connector slides may be an insertion/removal direction of the connector and a mating connector corresponding to the connector. By sliding the connector in the insertion/removal direction, the tip of the connector can be inserted into and disposed in a connector hole, and the insertion/removal of the mating connector is facilitated.

The connector may be supported by the substrate by holding portions elastically and slidably holding a first surface and a second surface of the substrate. With the holding portions, positioning in the vertical direction is made, so that the connector can be simply supported and is slidable from the preparation position to the mounting position.

The holding portions may be individually provided on both sides with the connector interposed therebetween in a direction substantially orthogonal to the direction in which the connector slides. By providing the holding portions on both sides of the connector, the connector can be stably supported and slid.

The holding portions have first abutment portions abutting on the first surface of the substrate and second abutment portions and third abutment portions abutting on the second surface of the substrate, in which the second abutment portions and the third abutment portions may be provided before and after the first abutment portions with respect to the direction in which the connector slides. By holding the substrate at least at three points in the front and the rear, the connector is stabilized.

The connector has a fixing portion fixing the connector to the substrate with a fixture, an electrode electrically contacting a mating connector, and a terminal conduction with the electrode, in which the connector may be configured so that the terminal is in non-contact with the substrate until the connector is fixed to the substrate by the fixture, and the holding portions are at least partially elastically deformed by fixing the connector to the substrate by the fixture, whereby the terminal contacts an electrode pad provided on the substrate. Thus, the deformation and cracks of the terminal can be prevented.

One of the connector and the substrate may have an engagement portion, the other of the connector and the substrate has a portion to be engaged, and the engagement portion and the portion to be engaged are configured to position the connector at the mounting position and the preparation position. The connector can be simply and accurately positioned by the engagement portion and the portion to be engaged.

The substrate may have a guide groove by which the connector is guided by entering of a frame body. According to such a guide groove, the connector can be simply and accurately guided.

The connector has a screw mount and the substrate has a screw hole provided at a position corresponding to the screw mount when the connector is located at the mounting position and a nut which is coaxial with the screw hole and fixed to a surface opposite to the abutment surface of the screw mount, and the connector and the substrate may be fixed to each other by screwing of the screw into the nut through the screw mount and the screw hole. Thus, the connector and the substrate can be firmly fixed to each other.

An electronic device according to a second aspect of the present invention has a first connector hole provided in the side surface of a chassis, a first connector which partially enters the first connector hole, and a substrate on which the first connector is mounted, in which the first connector is supported so as to be slidable with respect to the substrate from a preparation position to a mounting position, the first connector partially projects outwardly from an end portion of the substrate at least at the mounting position, and the first connector is fixed at the mounting position The substrate has the first connector on only a first side of both sides facing each other and has a second connector on a second side of the both sides, the first connector hole is provided in a first side surface of the chassis and a second connector hole is provided in a second side surface of the chassis, and the second connector may enter the second connector hole.

In such an electronic device, the connector of one side can be supported at the preparation position in attachment of the substrate to the chassis, and therefore, the connector does not interfere with the connector hole, and, after the attachment, the connector can be slid to the mounting position, and then a tip portion of the connector can be made to enter the connector hole. Therefore, the connectors can be properly arranged on both side surfaces and a small substrate, a relay cable, and the like become unnecessary, so that a reduction in the number of parts and simplification of an assembling process are achieved. The connector may be provided on two sides other than both the sides of the four sides in the substrate.

The number of the connectors on the first side may be smaller than the number of the connectors on the second side. Thus, by providing the connector on the side having a small number of the connectors, the number of processes of sliding the connector to the mounting position after assembling the substrate can be reduced.

Furthermore, a method for assembling an electronic device having a chassis, a connector hole provided in the side surface of the chassis, a connector which partially enters the connector hole, and a substrate on which the connector is mounted and which is attached to the chassis according to a third aspect of the present invention has a process of supporting the connector at a preparation position in the substrate, a process of attaching the substrate on which the connector is supported at the preparation position to the chassis, and a process of sliding the connector to a mounting position where the connector partially projects outwardly from an end portion of the substrate and partially enters the connector hole.

Thus, the connector is positioned at the preparation position in the second process and the substrate can be attached to the chassis without interfering with other parts, such as a connector hole frame. Then, in the third process, the connector can be slid to the mounting position and can be partially arranged in the connector hole.

According to the aspects of the present invention, the connector is supported so as to be slidable with respect to the substrate from the preparation position to the mounting position and the connector partially projects outwardly from the end portion of the substrate at at least the mounting position. By slidably supporting the connector as described above, interference with a part of the chassis can be avoided by disposing the connector at the preparation position in the attachment of the substrate to the chassis and the connector can be slid to the mounting position after the attachment. Thus, a small substrate, a relay cable, and the like become unnecessary, so that a reduction in the number of parts and simplification of an assembling process is achieved.

DETAILED DESCRIPTION OF THE INVENTION

Hereinafter, Examples of a connector•substrate assembly, an electronic device, and a method for assembling an electronic device according to an embodiment of the present invention are described in detail based on the drawings. The present invention is not limited by Examples.

Figure 1:
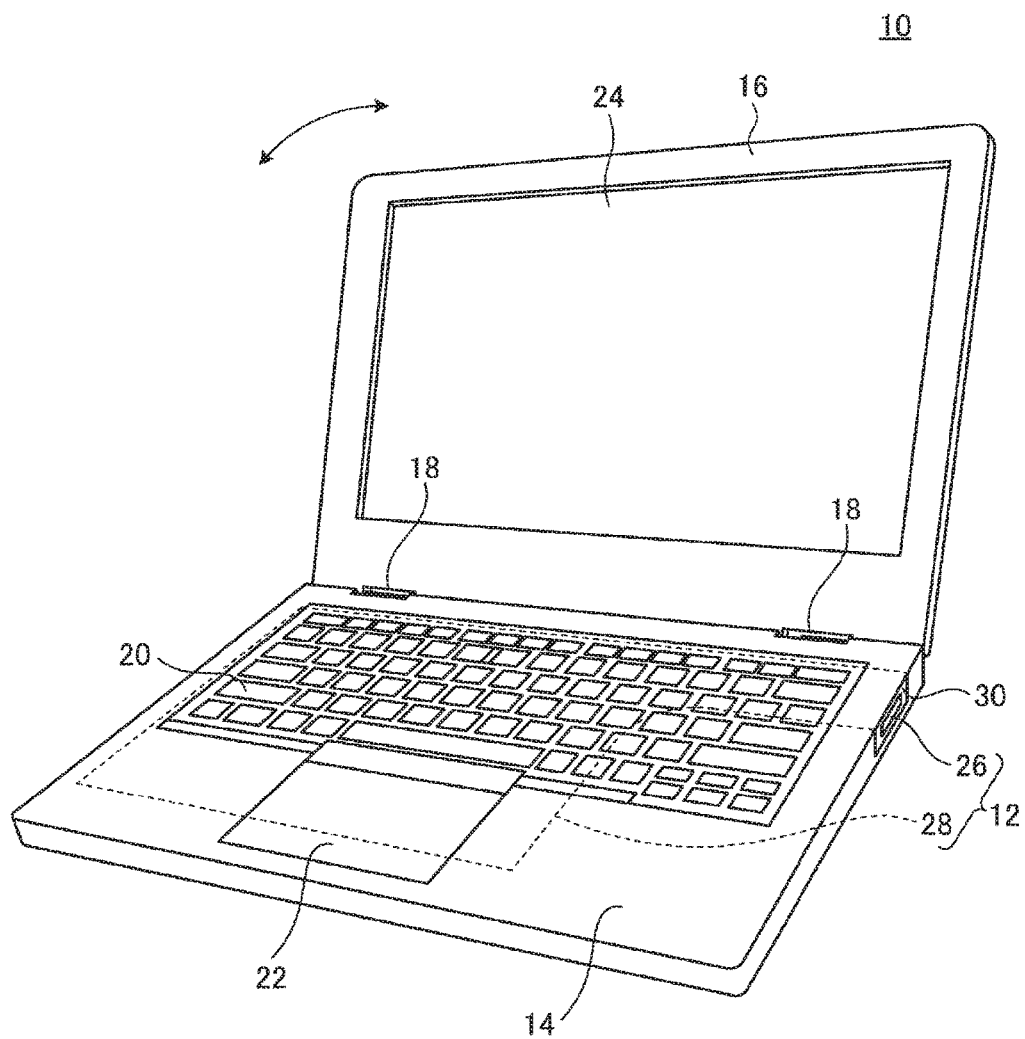
FIG. 1 is a perspective view of a Laptop PC according to an embodiment of the present invention.

FIG. 1 illustrates a perspective view of a Laptop PC 10 which is an electronic device according to an embodiment of the present invention and illustrates a connector•substrate assembly 12 according to an embodiment of the present invention. The connector•substrate assembly 12 is incorporated in a chassis 14 of the Laptop PC 10. The electronic device according to the embodiment of the present invention is not limited to the Laptop PC 10 and may be a desktop type PC, a mobile type tablet terminal, and the like, for example.

In the Laptop PC 10, a lid body 16 is openable and closable with respect to the chassis 14 by hinges 18 and the Laptop PC 10 becomes compact by closing the lid body 16, and thus is suitable for mobile use.

On the upper surface of the chassis 14, a keyboard device 20 and a touchpad 22 are provided. On the front surface of the lid body 16, a display device 24 occupying a greater part of the area thereof and a speaker and a camera which are not illustrated are provided.

The connector•substrate assembly 12 is incorporated in the chassis 14 and has a connector 26 and a substrate 28. The substrate 28 is a main substrate in the Laptop PC 10 and is provided almost over both right and left ends in the chassis 14. The connector 26 is provided at a deep portion on the right side of the substrate 28, i.e., the side close to the lid body 16.

Figure 2:
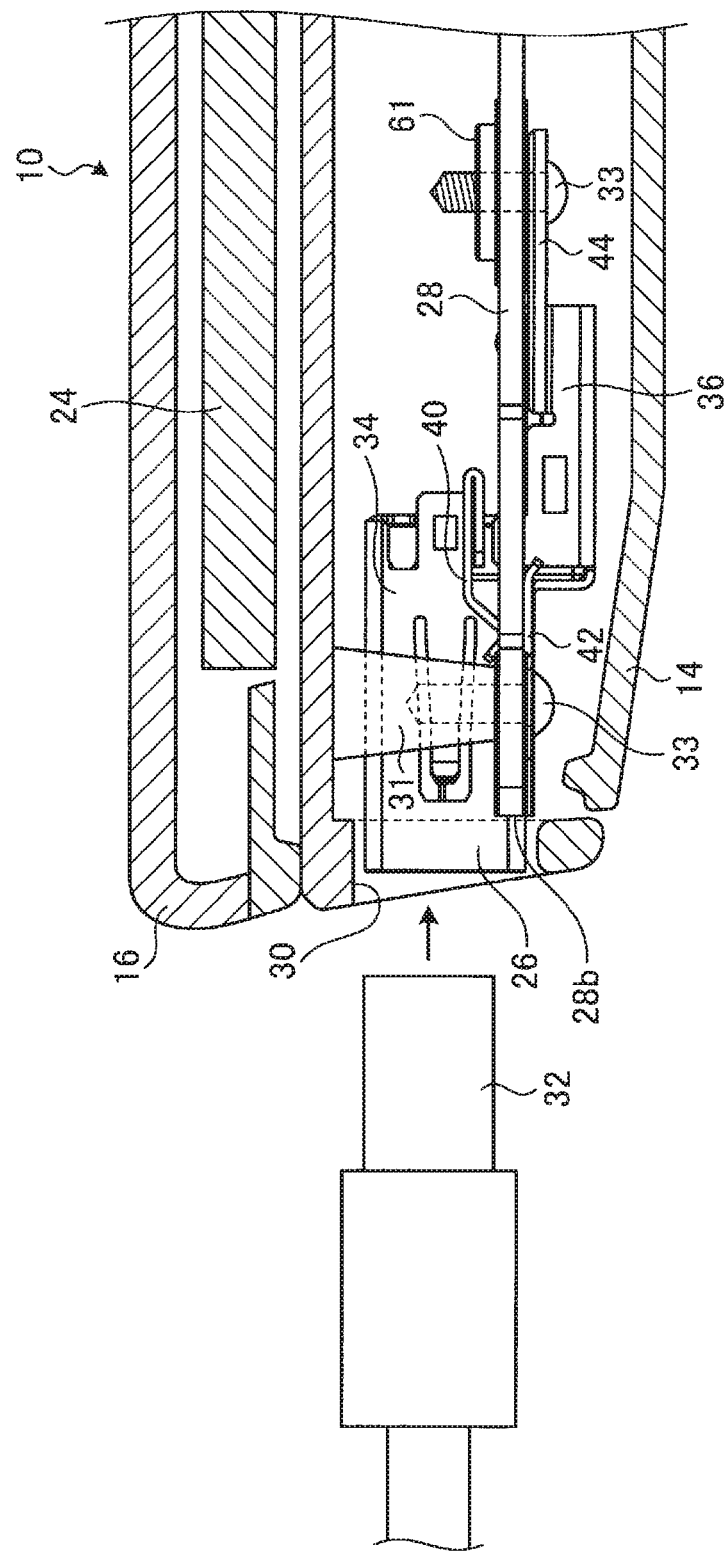
FIG. 2 is a cross-sectional view of a connector, a connector hole, and the circumference thereof as viewed from the rear surface side.

For convenience of description, the side where the connector 26 faces a plug connector 32 (refer to FIG. 2) is defined as the front and the opposite side is defined as the rear. A direction perpendicular to the sheet surface in FIG. 2 is defined as the width direction. A vertical direction is in accordance with the upper and lower sides of the sheet surface of FIG. 2. The left and right are based on a state where the Laptop PC 10 is viewed from the front as illustrated in FIG. 1. The names of these directions are merely defined for convenience of description and the present invention is not limited thereto. It should be noted that FIG. 2 to FIG. 4 and FIG. 9 to FIG. 14 are views of the substrate 28 as viewed from the lower surface or the rear surface, in which the right and the left are reversed.

As illustrated in FIG. 2, the side surface shape of the chassis 14 has an inclined surface which narrows toward the bottom from the viewpoint of design. A tip portion of the connector 26 is exposed from a connector hole 30 on the right side surface in the chassis 14 and a corresponding plug connector 32 is insertable into/removable from the connector 26. The connector 26 is a USB connector, a HDMI (Registered Trademark) connector, a LAN connector, an optical connector, and the like, for example. A mating plug connector 32 is inserted into/removed from the connector 26. The connector 26 is fixed to a post 31 provided in the chassis 14 by screws (fixture) 33 with the substrate 28 interposed therebetween. The screws 33 include a bolt in a broad sense.

Figure 3:
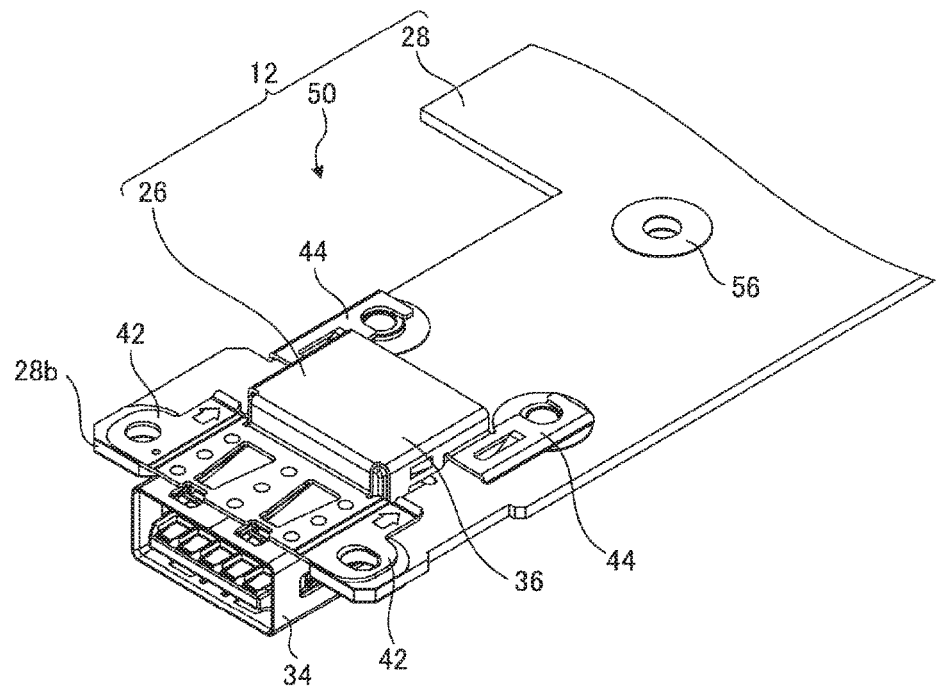
FIG. 3 is a perspective view of a slide connector mounting portion and a connector on the substrate as viewed from the front lower left with an insertion/removal surface of the connector as a reference.
Figure 4:
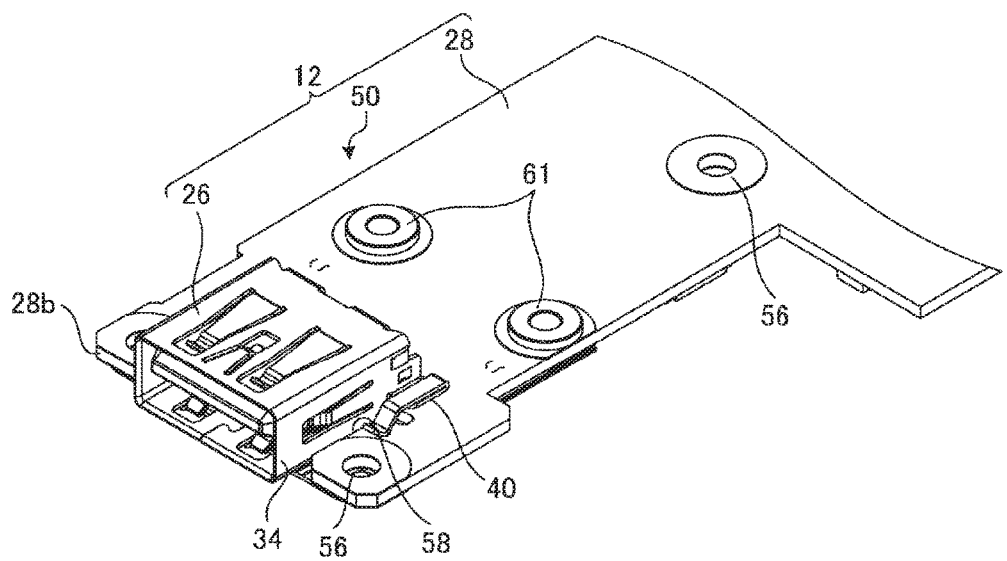
FIG. 4 is a perspective view of the slide connector mounting portion and the connector on the substrate as viewed from the front upper right with the insertion/removal surface of the connector as a reference.

FIG. 3 is a perspective view of a slide connector mounting portion and the connector on the substrate as viewed from the front lower left with the insertion/removal surface of the connector as a reference. FIG. 4 is a perspective view of the slide connector mounting portion and the connector on the substrate as viewed from the front upper right with the insertion/removal surface of the connector as a reference. As illustrated in FIG. 3 and FIG. 4, the connector 26 is provided on the right side of the substrate 28.

Figure 5:
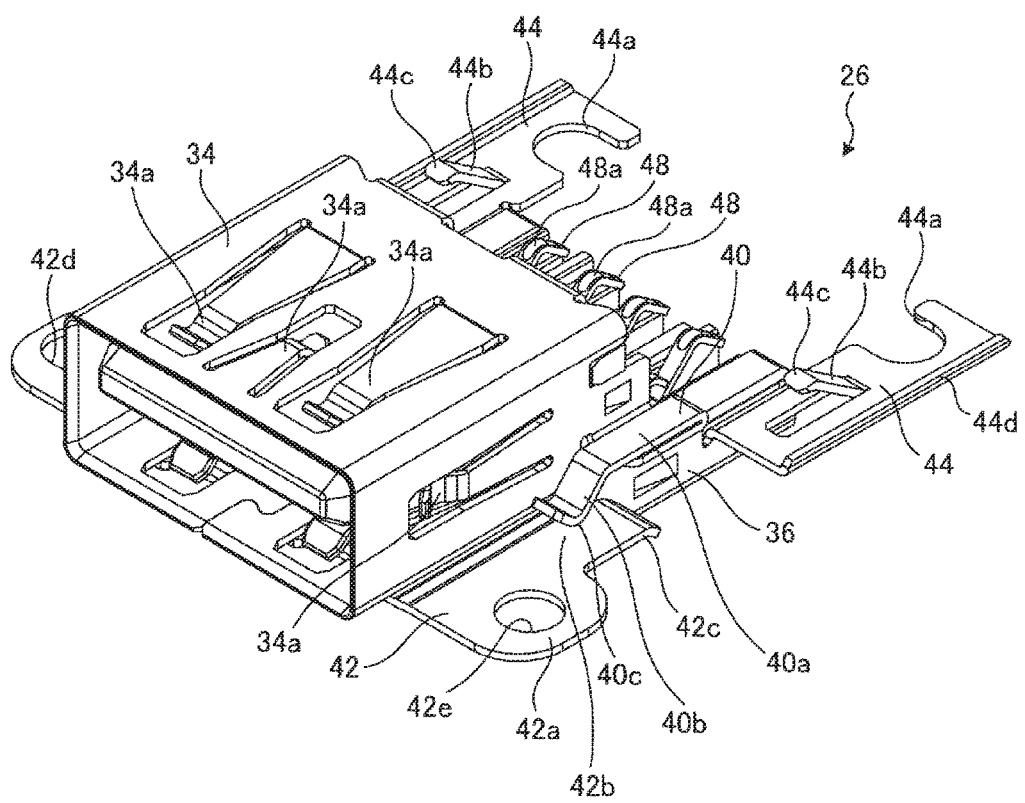
FIG. 5 is a perspective view of the connector as viewed from the front upper right with the insertion/removal surface of the connector as a reference.
Figure 6:
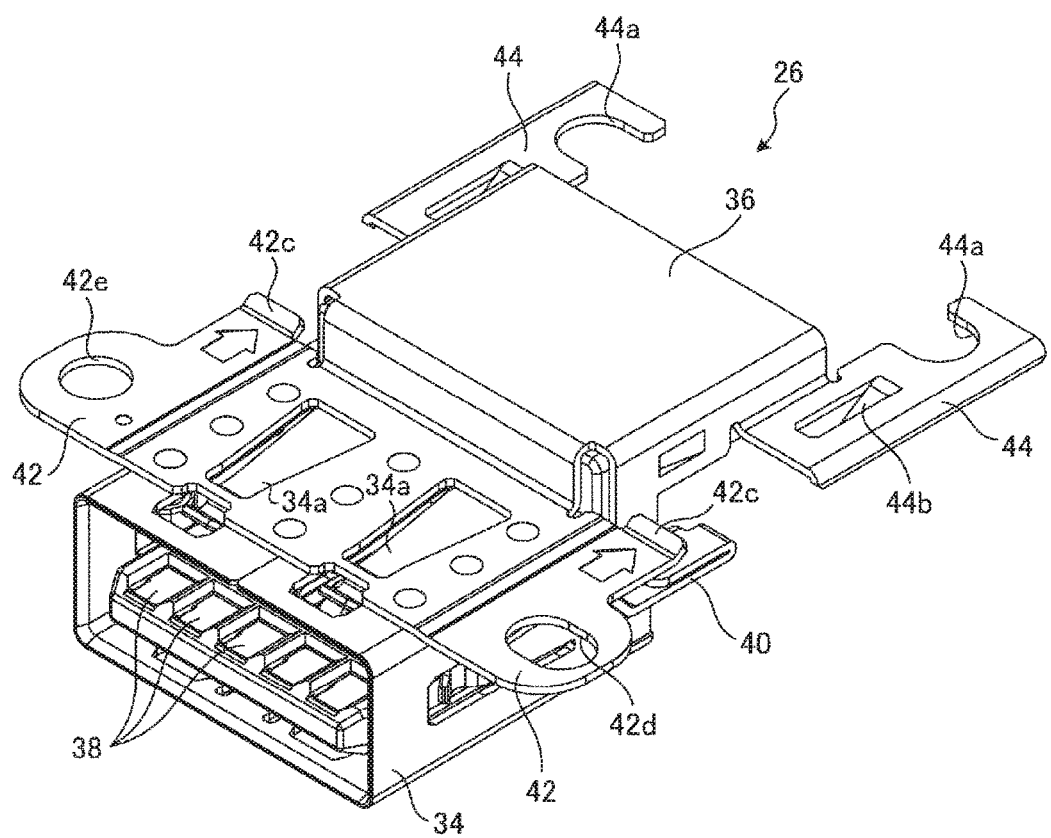
FIG. 6 is a perspective view of the connector as viewed from the front lower left with the insertion/removal surface of the connector as a reference.
Figure 7:
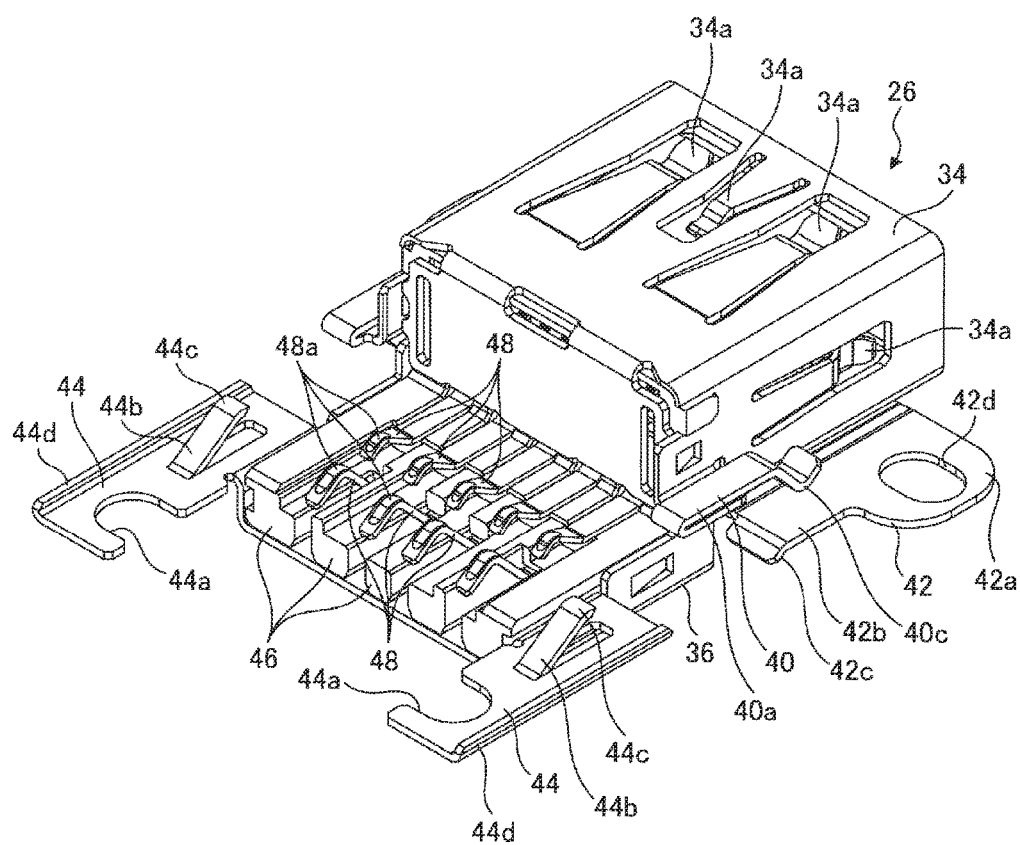
FIG. 7 is a perspective view of the connector as viewed from the back upper left with the insertion/removal surface of the connector as a reference.
Figure 8:
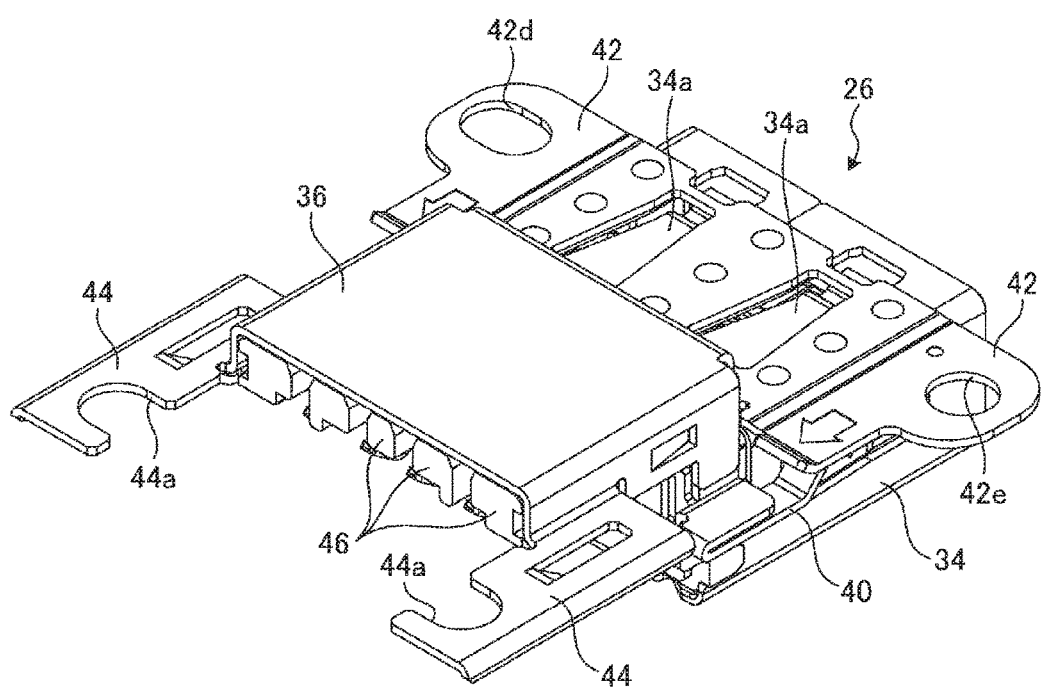
FIG. 8 is a perspective view of the connector as viewed from the back lower right with the insertion/removal surface of the connector as a reference.

As illustrated in FIG. 5, FIG. 6, FIG. 7, and FIG. 8, the connector 26 is configured from a frame body 34 and a box 36 as the base. The frame body 34 has a slightly flat box shape, the front of which is opened, with a portion inserted into a guide groove 58 (refer to FIG. 10) described later in the substrate 28, and has nine electrodes 38 therein. The electrodes 38 are portions which are individually conduction with electrodes of the mating plug connector 32 and are disposed so as to be divided into two stages in the frame body 34. In FIG. 6, five electrodes 38 of the electrodes 38 are illustrated and the remaining four electrodes 38 are hidden. In the four side surfaces of the left, right, top, and bottom side surfaces of the frame body 34, one to three inward bent pieces 34a elastically supporting the plug connector 32 to be inserted, are formed.

The box 36 has the same width as that of the frame body 34, is provided on the lower side of the rear side in the frame body 34, and extends backward. The box 36 is disposed on the lower surface of the substrate 28.

The connector 26 has first projection pieces (holding portion, first abutment portion) 40,40, second projection pieces (holding portion, second abutment portion, fixing portion) 42,42, and third projection pieces (holding portion, third abutment portion, fixing portion) 44,44, each forming one pair of right and left projection pieces. The first projection pieces 40, the second projection pieces 42, and the third projection pieces 44 are holding portions holding the substrate 28. The frame body 34, the box 36, the first projection pieces 40, the second projection pieces 42, and the third projection pieces 44 are formed by bending one metal plate. The connector 26 has nine further terminals 48 supported by insulators 46 in the box 36.

The first projection pieces 40 are provided so as to project sideways from both right and left side surfaces in a rear portion of the frame body 34 and have overlapped portion 40a bent and overlapped at the rear end, inclined portions 40b projecting obliquely forward and downward from the overlapped portions 40a, and bent portions 40c (engagement portion) with short tips. The bent portions 40c are bent by about 90° obliquely upward into an arc shape. The bent portions 40c are disposed near the center of the side surfaces of the frame body 34 as viewed in side view.

The second projection pieces 42 are provided to project sideways from the lower end of both the right and left side surfaces of the frame body 34 and have screw mounts 42a on the front, support surfaces 42b continuously extending backward from the screw mounts 42a, and short bent portions 42c provided in the rear ends of the support surfaces 42b. A screw hole 42e is provided in the screw mount 42a in the second projection piece 42 on the right side as viewed in the insertion/removal direction and a screw hole 42d is provided in the screw mount 42a in the second projection piece 42 on the left side as viewed in the insertion/removal direction. The screw hole 42e has a circular shape. The screw hole 42d is a slightly flat long hole in the width direction. Due to the fact that one screw hole 42d has a flat shape, the screw 33 (refer to FIG. 2) is easily inserted.

The support surfaces 42b have a substantially square shape and support the substrate 28 from the lower surface integrally with inside portions of the screw mounts 42a. The bent portions 42c are gently bent obliquely backward and downward.

The third projection pieces 44 are provided so as to project sideways and backward from both the right and left side surfaces in the rear of the box 36 and have screwing notches 44a which are provided in portions projecting backward, have a semicircular shape, and are opened inwardly, elastic nails 44b raised from the center toward the front, and short bent portions 44c provided at the tips of the elastic nails 44b. The circumference of the screwing notches 44a serves as a screw mount. The elastic nails 44b are formed by cutting and bending a part of the third projection pieces 44. The bent portions 44c are gently bent in a direction in which the inclination angle of the elastic nails 44b becomes gentle. The elastic nails 44b are raised by about 30° to plane portions of the third projection pieces 44, and the bent portions 44c at the tips are set at slightly high positions. The third projection pieces 44 have the same height and the same width as those of the support surfaces 42b of the second projection pieces 42 and support the substrate 28 from the lower surface with the second projection pieces 42. Lateral sides 44d are bent with a narrow width.

The first projection pieces 40, the second projection pieces 42, and the third projection pieces 44 act as holding portions elastically and slidably holding the upper surface (first surface) and the lower surface (second surface) of the substrate 28, so that the connector 26 is supported by the substrate 28. Moreover, with the holding portions, the positioning in the vertical direction is made, so that the connector 26 can be simply supported and can slide from the preparation position to the mounting position. Furthermore, each of these holding portions are provided on both sides with the connector 26 interposed therebetween in a direction orthogonal (or substantially orthogonal) to a direction in which the connector 26 slides, and therefore the connector 26 can be stably supported and slid.

The terminals 48 are disposed in two stages in which five terminals 48 are disposed in the front stage and four terminals 48 are disposed in the rear stage and the terminals 48 each are in conduction with the electrodes 38. The terminals 48 are raised backward and have about 90° bent portions 48a and tip portions are directed obliquely downward. The bent portions 48a in the terminals 48 are set at positions slightly lower than the bent portions 44c of the elastic nails 44b.

Next, the substrate 28 is described. The substrate 28 is a double-sided mounting printed wiring board and, in accordance with the upper and lower sides of the chassis 14, the upper side is defined as the upper surface and the lower side is defined as the lower surface.

Figure 9:
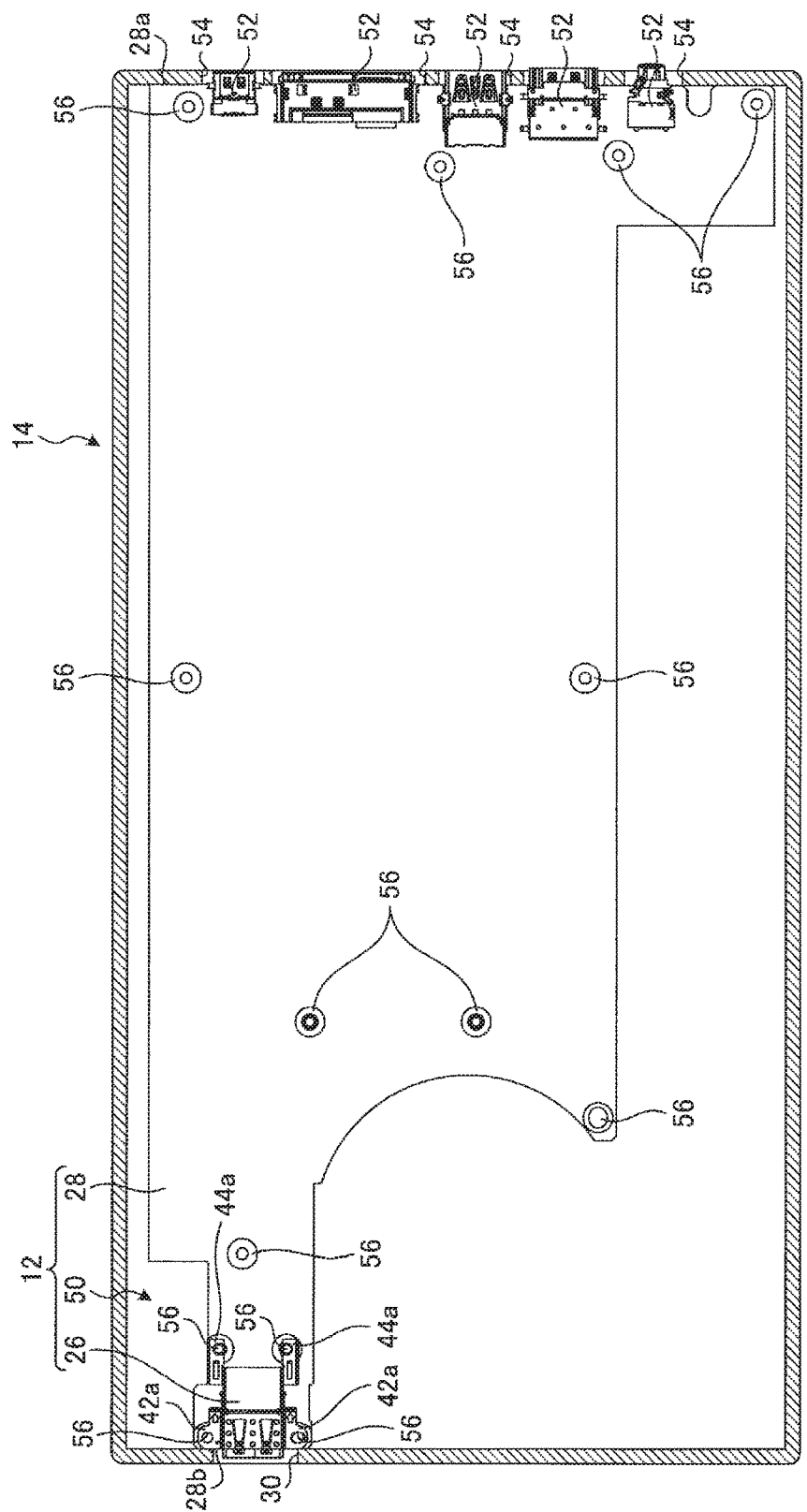
FIG. 9 is a partial cross-sectional view of a chassis and a substrate attached thereinto as viewed from the lower surface.

As illustrated in FIG. 9, the substrate 28 has a special horizontally long shape to avoid interference with other devices in the chassis 14. The breadth of the substrate 28, i.e., the length from a left side 28a to a right side 28b, is slightly shorter than the inner width of the chassis 14. The left side 28a of the substrate 28 is shorter than the vertical width of the inside of the chassis 14. The right side 28b has a narrow width corresponding to a required width for a slide connector mounting portion 50 carrying the connector 26. The width of the slide connector mounting portion 50 is almost equal to the width of the connector 26.

On the left side 28a, five connectors (other connectors) 52, different from the type mounted on the substrate 28, are provided and tip portions of the connectors each enter connector holes (other connector holes) 54 provided in the left side surface of the chassis 14. The connectors 52 are mounted and fixed to the substrate 28 by soldering. Five connector holes 54 are provided corresponding to the number of the connectors 52. However, the number of the connector holes 54 is set to 4 or less and one of the connector holes 54 may be shared by the plurality of connectors 52.

A plurality of screw holes 56 are provided in the substrate 28 and almost all the screw holes 56 are fixed to the post 31 (refer to FIG. 2) of the chassis 14 by the screws 33. The connector 26 is fixed to the chassis 14 by the screws 33 with the screw mounts 42a together with the substrate 28. In FIG. 9, parts other than the connectors 26 and 52 in the substrate 28 are omitted but most main semiconductor parts in the Laptop PC 10 are mounted. As is understood from FIG. 9, the tips of the left connectors 52 project outwardly to the left (right side in FIG. 9) from the left side 28a, which is an end portion of the substrate 28 and the tip of the right connector 26 projects outwardly to the right (left side in FIG. 9) from the right side 28b, which is an end portion of the substrate 28. Therefore, the connectors 52 and the connector 26 cannot be made to enter the left connector holes 54 and the right connector hole 30 in the shapes as they are in assembling. Then, in assembling, the connector 26 is supported/temporarily fixed to the preparation position where the connector 26 does not interfere with the frame portion of the connector hole 30, and then the connector 26 is slid forward after attaching the substrate 28 to the chassis 14 as described later. The term "outwardly" refers to a direction toward the outside of the substrate 28 as viewed in plan.

Figure 10:
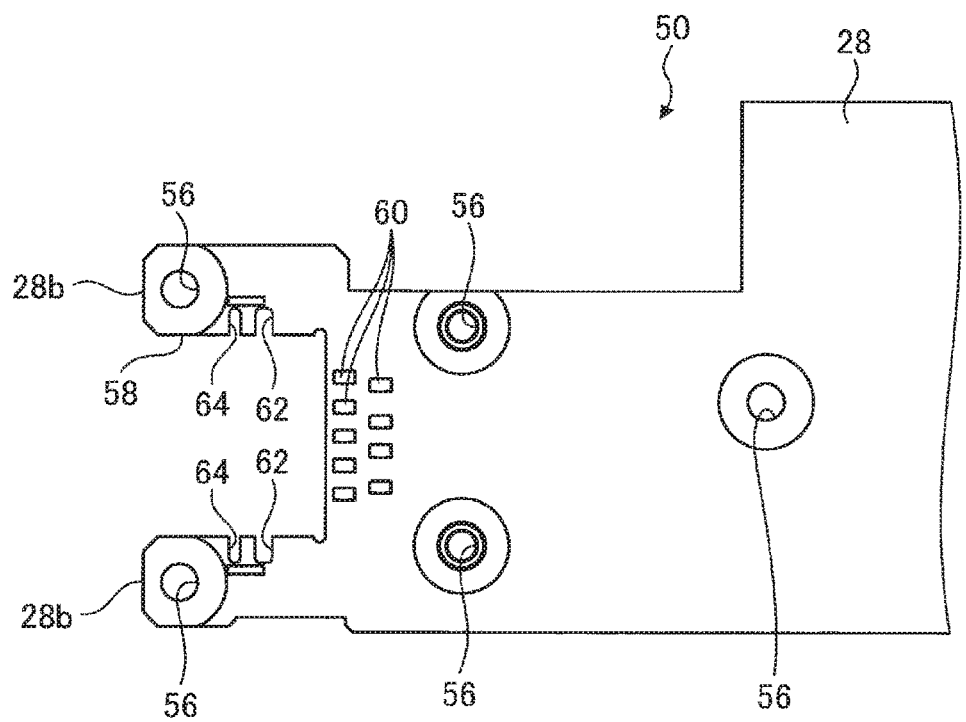
FIG. 10 is a bottom view of the slide connector mounting portion on the substrate.
Figure 11:
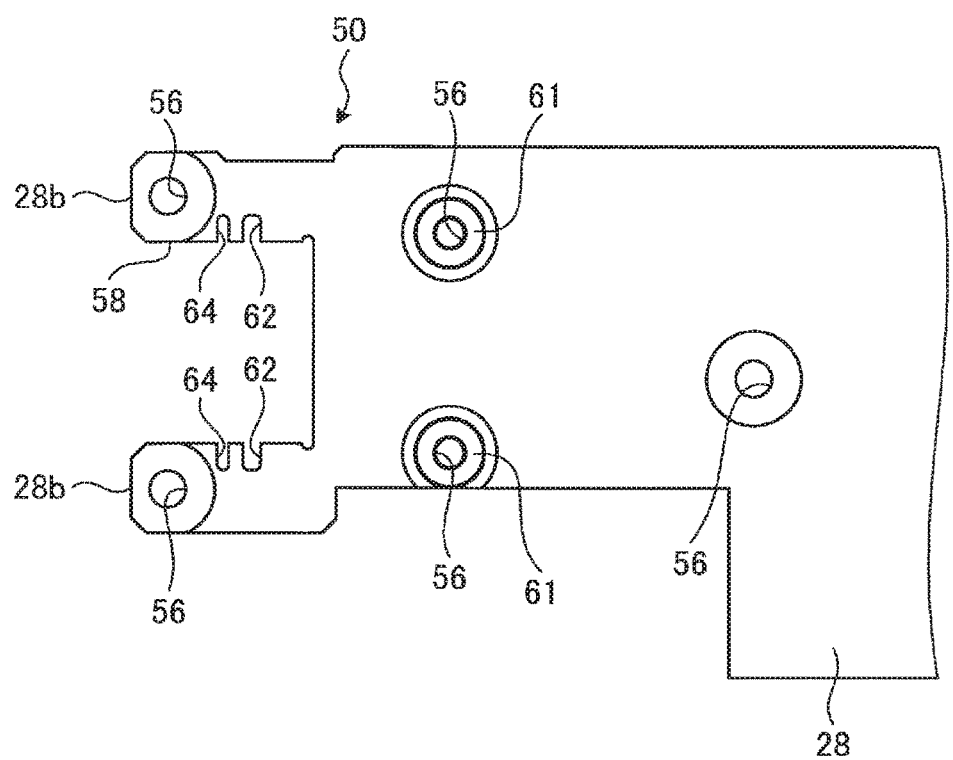
FIG. 11 is a top view of the slide connector mounting portion on the substrate.

As illustrated in FIG. 10 and FIG. 11, the slide connector mounting portion 50 has a shape of projecting rightward from another portion in the substrate 28, and has four screw holes 56, the guide groove 58, and nine electrode pads 60 provided on the lower surface.

Two screw holes 56 of the four screw holes 56 in the slide connector mounting portion 50 correspond to the screw mounts 42a and are provided near the right side 28b and the remaining two screw holes 56 corresponded to the screwing notches 44a and are provided at a slightly deeper position. In the circumference of the two screw holes 56 corresponding to the latter screwing notches 44a, annular metal nuts 61 are coaxially surface mounted to the screw holes 56 and are in conduction with the earth ground on the substrate 28. The nuts 61 are fixed to the upper surface opposite to the lower surface on which the third projection pieces 44 having the corresponding screwing notches 44a abut. Therefore, the third projection pieces 44 and the substrate 28 are held to be fixed between the screws 33 and the nuts 61 (refer to FIG. 2).

The guide groove 58 is a rectangular groove which is opened rightward and guides the frame body 34 of the connector 26 in the forward and backward direction, and the width is set so as to allow the frame body 34 to slide. In both inner surfaces in the guide groove 58, first positioning notches (portion to be engaged) 62, 62 and second positioning notches (engagement portion) 64, 64 are provided. The first positioning notches 62 and the second positioning notches 64 each have a narrow width and extend to both sides.

The guide groove 58 is formed in the vertical direction with respect to the right side 28b, so that the connector 26, the frame body 34 of which is fitted into the guide groove 58, is accurately guided in the horizontal direction. The forward and backward direction of the connector 26 is the insertion/removal direction of the mating plug connector 32 and the opening direction of the connector hole 30, so that the tip of the connector 26 is accurately guided to the connector hole 30, and the insertion/removal of the plug connector 32 is facilitated.

The first positioning notches 62 and the second positioning notches 64 position the connector 26, supported by the slide connector mounting portion 50 at the preparation position and the mounting position by successive engagement of the bent portions 40c of the first projection pieces 40 (refer to FIG. 5).

The nine electrode pads 60 are disposed so as to be divided into two stages at a position slightly deeper than the guide groove 58 and are portions where the nine electrode pads 60 each contact to be in conduction with the terminals 48 (refer to FIG. 7) of the connector 26.

Next, a method for assembling the Laptop PC 10 having the connector•substrate assembly 12 configured as described above is described. The substrate 28 is attached to the chassis 14 from the lower surface. The connectors on the left side 28a are already mounted on the substrate 28 and a rear cover of the chassis 14 is removed.

Figure 12:
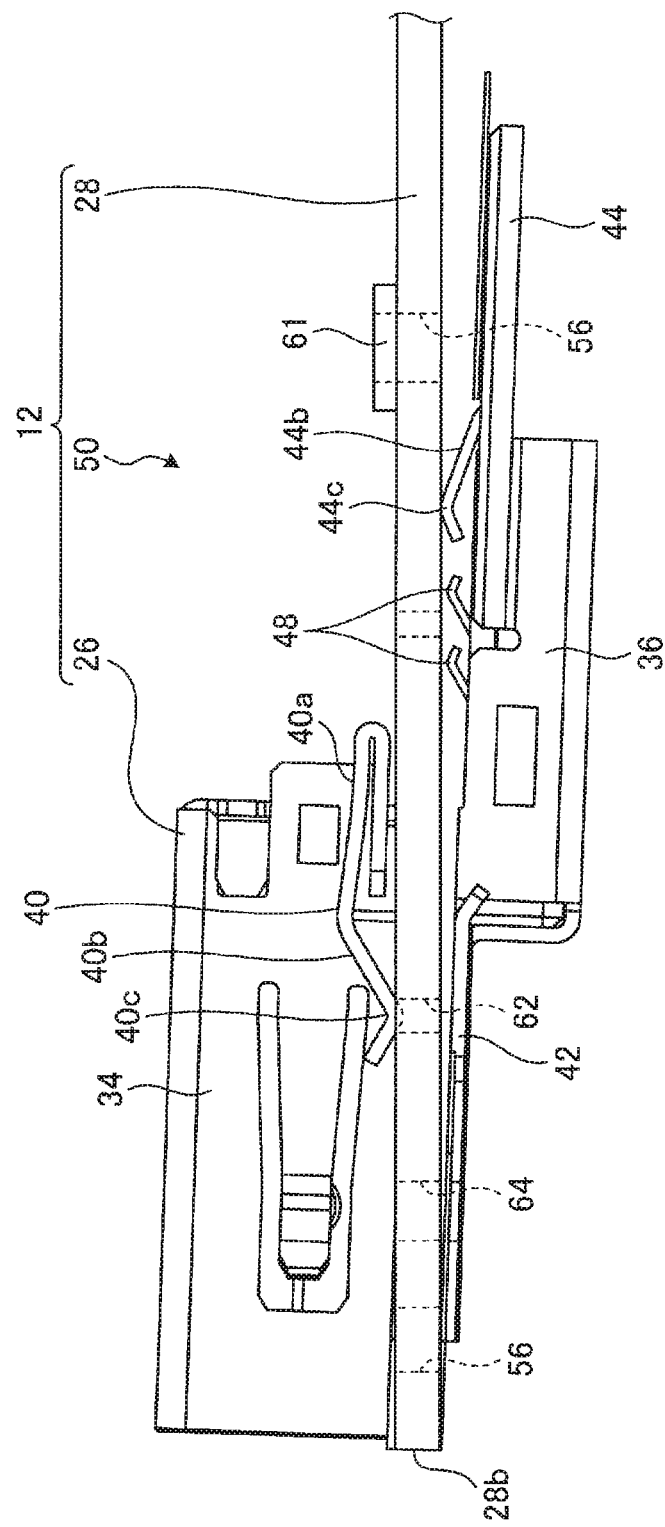
FIG. 12 is a side view of the slide connector mounting portion and the connector supported and positioned at a preparation position.

First, as illustrated in FIG. 12, the connector 26 is supported and temporarily fixed at the preparation position of the slide connector mounting portion 50 on the right side in the substrate 28 (first process). The connector 26 is supported and temporarily fixed due to the fact that the frame body 34 is fitted into the guide groove 58; and the substrate 28 is held by the first projection pieces 40, the second projection pieces 42, and the third projection pieces 44. Due to the fact that the frame body 34 is fitted into the guide groove 58, the connector 26 is supported from the right and the left to be positioned in the width direction and also stably, simply, and accurately guided in the forward and backward direction.

While the bent portions 40c of the first projection pieces 40 as the holding portions elastically press the upper surface of the substrate 28, front portions of the second projection piece 42 and the elastic nails 44b of the third projection pieces 44 support the lower surface of the substrate 28. The second projection pieces 42 and the third projection pieces 44 are provided before and after the bent portions 40c with respect to the direction in which the connector 26 slides. By holding the substrate 28 at least at three points in the front and the rear as described above, the connector 26 is stabilized in the vertical direction and is slidable.

Figure 13:
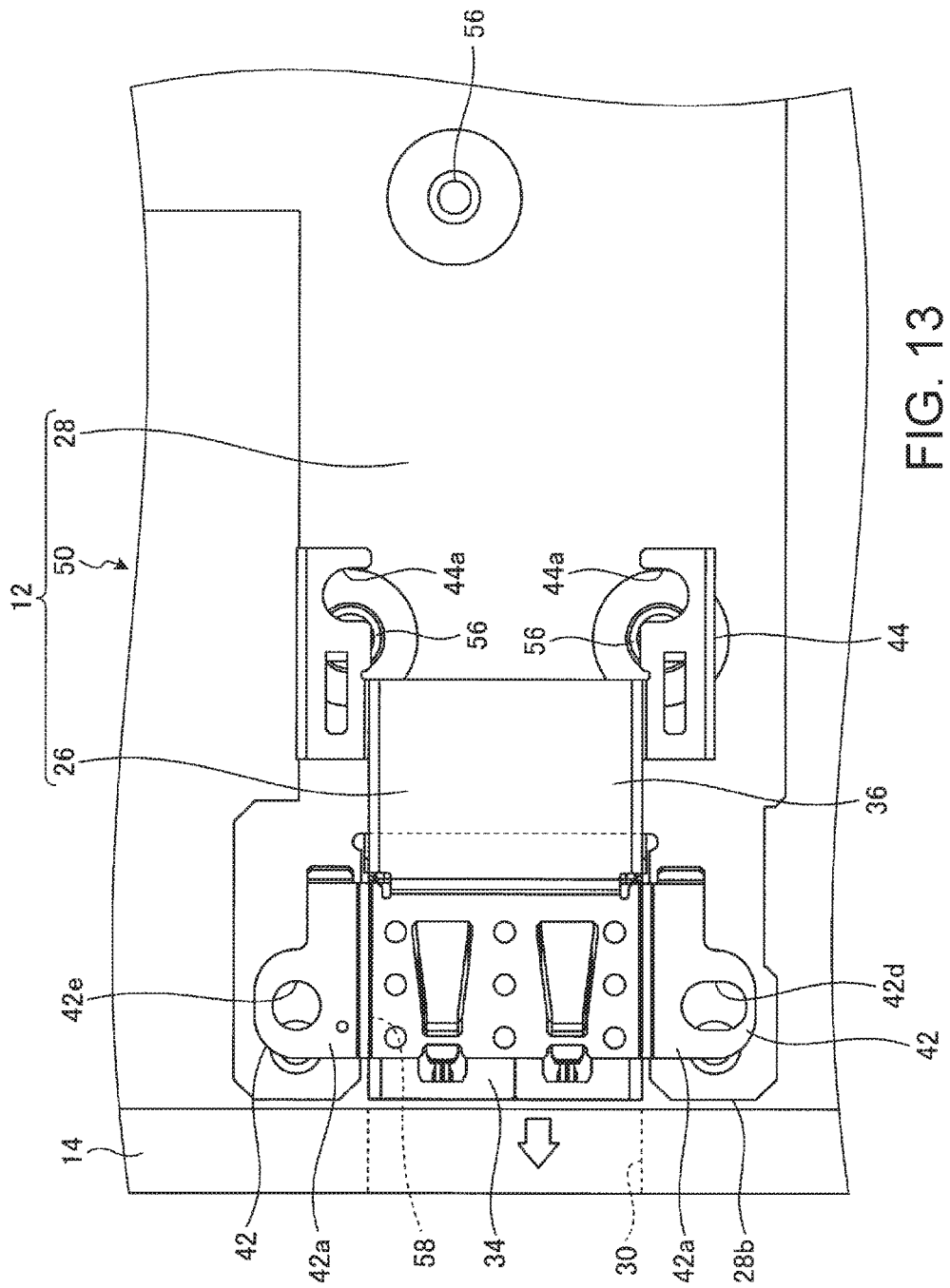
FIG. 13 is a view illustrating a state where the substrate on which the connector is supported and positioned at the preparation position is attached to the chassis.

Furthermore, top portions of the bent portions 40c of the first projection pieces 40 enter the first positioning notches 62 at this time, whereby the connector is positioned at the preparation position. The preparation position is a position where the connector 26 is temporarily retracted so that the connector 26 does not interfere with the frame portion of the connector hole 30 when attaching the substrate 28 to the chassis 14. As illustrated in FIG. 12 and FIG. 13, it is preferable to set the preparation position to a position where the tip of the connector 26 is in agreement with the right side 28b or a deeper position in the rear because the connector 26 has no possibility of interfering with the frame portion of the connector hole 30. However, the tip of the connector 26 may slightly project from the right side 28b insofar as it is confirmed the connector 26 does not interfere with the frame portion.

Due to the fact that the bent portions 40c enter the first positioning notches 62 to be engaged, the connector 26 can be simply and accurately positioned and, moreover, does not shift even by slight vibration. For the positioning of the connector 26 to the preparation position, units other than the first positioning notches 62 may be used. For example, a position where the frame body 34 hits the deepest portion of the guide groove 58 may be set as the preparation position. The engagement portion and the portion to be engaged for the positioning of the preparation position and the mounting position described later may be reversed. For example, small projections for engagement may be provided on both side surfaces of the guide groove 58 and small recessed portions for engagement may be provided in the side surface of the frame body 34.

Since the bent portions 44c are provided at positions slightly higher than the surface of the substrate 28, the terminals 48 are in non-contact with the lower surface of the substrate 28 at this time.

Next, the substrate 28 on which the connector 26 is supported at the preparation position is attached to the chassis 14 (second process). At this time, the substrate 28 is inserted obliquely downward to the left while being inclined in such a manner that the left side is slightly lower than the right side so that the connectors 52 on the left side 28a enter the left side connector holes 54, and then the right side is lowered. Thus, the substrate 28 is properly disposed within the chassis 14 and, as illustrated on the right side in FIG. 9, the tips of the connectors 52 accurately enter the connector holes 54. Moreover, as illustrated in FIG. 13, the connector 26 positioned at the preparation position is disposed at a position facing an inner opening of the connector hole 30 without interfering with the frame portion of the connector hole 30 on the right side. Thereafter, the screws 33 are inserted into the plurality of screw holes 56 (refer to FIG. 9) to be screwed into the post 31 of the chassis 14 to fix the substrate 28. However, at this time, the four screw holes 56 in the slide connector mounting portion 50 are not screw fixed.

Figure 14:
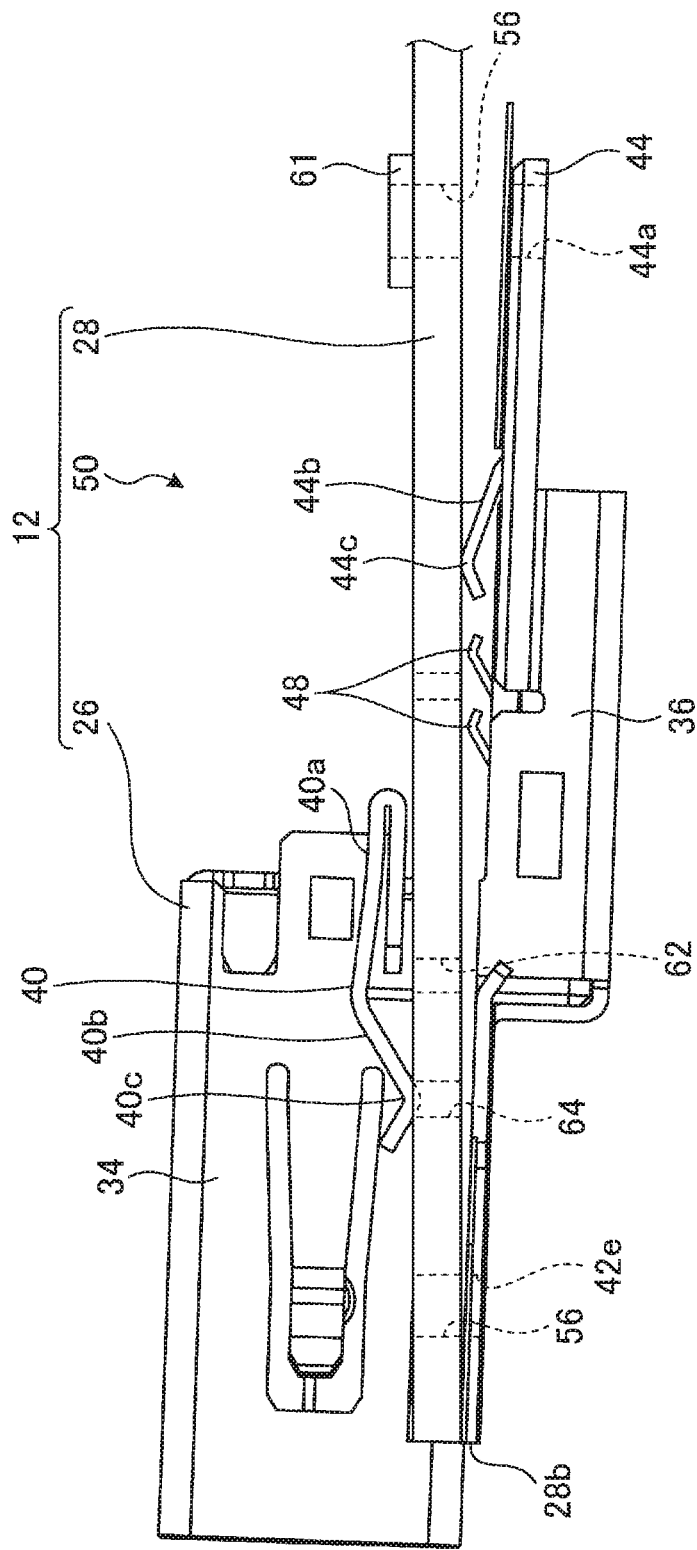
FIG. 14 is a side view of the slide connector mounting portion and the connector supported and positioned at the mounting position.

Next, as indicated by an arrow of FIG. 13 and illustrated in FIG. 14, the connector 26 at the preparation position is slid forward to be moved to the mounting position (third process). Thus, the tip of the connector 26 projects outwardly to the right (the left side direction in FIG. 2 and FIG. 14) from the right side 28b which is an end portion of the substrate 28 to enter the connector hole 30.

At this time, the side surface of the frame body 34 is guided by the guide groove 58 so that the connector 26 can simply and accurately slide forward and, moreover, the connector 26 is held and supported by the first projection pieces 40, the second projection pieces 42, and the third projection pieces 44, and thus the connector 26 is not disconnected also in the vertical direction.

The bent top portions formed by the bent portions 40c and the bent portions 44c elastically contact the substrate 28 with moderate pressure and, moreover, the substrate 28 is easily slid due to the top shapes, and thus is not damaged. Moreover, the bent portions 44c are provided at a position slightly higher than the surface of the substrate 28, and therefore the terminals 48 are in non-contact with the lower surface of the substrate 28 at this time and can be slid in the non-contact state to the substrate 28, and thus the deformation of and damages to the terminals 48 can be prevented.

Furthermore, the bent portions 40c engaged with the first positioning notches 62 at the preparation position move ahead to be engaged with the second positioning notches 64, and thus the connector 26 is positioned at the mounting position. Herein, the mounting position is a regular attachment position of the connector 26 to the substrate 28 and is a position where the tip of the connector 26 enters the connector hole 30 and the mating plug connector 32 (refer to FIG. 2) can be accurately inserted/removed. The slide operation of the connector 26 can be achieved by a simple operation of merely slightly pressing the frame body 34 toward the front, for example, and the bent portions 40c are disconnected from the first positioning notches 62 to enter the second positioning notches 64 following the operation. At this time, a light click feeling is obtained, so that an operator can recognize that the connector 26 is positioned at the mounting position.

Subsequently, the screws 33 are inserted into the two screw mounts 42a of the connector 26 and the two screw holes 56 corresponding thereto on the right side in the slide connector mounting portion 50, and then screwed into the post 31 on the rear side, whereby the substrate 28 is fixed to the chassis 14. Thus, the connector 26 and the substrate 28 can be stably fixed. Moreover, the screws 33 are inserted into the two screwing notches 44a of the connector 26 and the remaining two screw holes 56 corresponding thereto in the slide connector mounting portion 50, and then screwed into the nuts 61 on the opposite side, whereby the connector 26 is more securely fixed to the substrate 28 and the frame body 34 of the connector 26 and the ground of the box 36 are sufficiently secured, so that the transmission and reception of electric signals are stabilized. While the upper surface of the substrate 28 is supported by the post 31, the lower surface is supported by the four corners of the support surfaces 42b and the third projection pieces 44 of the connector 26, so that the connector 26 and the substrate 28 are stabilized.

By the fixation by the screws 33, the elastic nails 44b are elastically deformed to be tilted, the lower surface of the substrate 28 and the box 36 are brought into close contact with each other, and then the nine terminals 48 individually contact the electrode pads 60 provided on the substrate 28 to be pressed, so that a stable conduction state is secured. The nut 61 is metal and can be screwed with a relatively strong torque by the screw 33. Therefore, the elastic terminals 48 can be set to have relatively high rigidity and can be brought into strong contact with the electrode pads 60, so that certain conduction is obtained. Thus, soldering treatment between the terminals 48 and the electrode pads 60 can be omitted and the connector 26 can be removed from the substrate 28 and the substrate 28 can be removed from the chassis 14 as necessary in maintenance or the like. However, the terminals 48 and the electrode pads 60 may be subjected to soldering treatment depending on the design conditions. The screw 33 as used herein is suitable for the nut 61 and includes a bolt.

Thereafter, the rear cover of the chassis 14 is attached, so that the assembling work of the substrate 28 to the chassis 14 is completed.

As described above, in the connector•substrate assembly 12 and the Laptop PC 10 according to this embodiment, by supporting the connector 26 so as to be slidable with respect to the substrate 28, the connector 26 can be disposed at the preparation position in the attachment of the substrate 28 to the chassis 14 and can be slid to the mounting position after the attachment, so that an additional small substrate, an additional relay cable, and the like become unnecessary, so that a reduction in the number of parts and simplification of the assembling process are achieved. An allowance is given to the space of the substrate 28 and the like corresponding to the space of a small substrate, a relay cable, and the like which become unnecessary.

Moreover, the connector 26 can be advanced by only a required distance to be caused to enter the connector hole 30 and the mating plug connector 32 can be properly removed and inserted. In particular, even when the side surface shape of the chassis 14 is inclined, by sufficiently causing the connector 26 to enter the connector hole 30, the attachment to the connector 26 can be achieved without interfering with the frame portion of the connector hole 30 by the housing of the plug connector 32.

The connector 26 to be slid is provided on the right side 28b side instead of the left side 28a having a large number of the connectors 52. Thus, by providing the connector 26 which can be slidable on the side having a small number of connectors, the number of processes of sliding the connector to the mounting position after the assembling of the substrate 28 decreases. The connector 26 may be provided on two sides of the front side and the rear side other than the left and right sides of the four sides of the substrate 28, and then the tips thereof may be caused to enter the corresponding connector holes.

The present invention is not limited to the embodiment described above, and it is a matter of course that the present invention can be freely altered without deviating from the scope of the present invention.

We claim:

1. An electrical connector•substrate assembly comprising:
    a electrical connector; and
    a substrate on which the connector is mounted, wherein:
    the connector is supported so as to be slidable with respect to the substrate, from a preparation position to a mounting position,
    the connector partially projects outwardly, from an end portion of the substrate, at least at the mounting position, and
    the connector, at the preparation position, slides outwardly from the end portion of the substrate to the mounting position.

2. The electrical connector•substrate assembly according to claim 1, wherein:
    a direction in which the connector slides is an insertion/removal direction of the connector and a mating connector corresponding to the connector.

3. The electrical connector•substrate assembly according to claim 1, wherein:
    the connector is supported by the substrate by holding portions elastically and slidably holding a first surface and a second surface of the substrate.

4. The electrical connector•substrate assembly according to claim 3, wherein:
    the holding portions are individually provided on both sides of the connector and in a direction substantially orthogonal to the direction in which the connector slides.

5. The electrical connector•substrate assembly according to claim 3, wherein:
    the holding portions comprise:
        a first abutment portion abutting on the first surface of the substrate,
        a second abutment portion and a third abutment portion abutting on the second surface of the substrate, and
        the second abutment portion and the third abutment portion are used before and after the first abutment portion with respect to the direction in which the connector slides.

6. The electrical connector•substrate assembly according to claim 3, wherein:
    the connector comprises:
        a fixing portion fixing the connector to the substrate with a fixture,
        an electrode electrically contacting a mating connector, and
        a terminal which is in conduction with the electrode, wherein:
        the connector is configured so that the terminal is in non-contact with the substrate until the connector is fixed to the substrate by the fixture and the holding portions are at least partially, elastically deformed by fixing the connector to the substrate by the fixture, whereby the terminal contacts an electrode pad on the substrate.

7. The electrical connector•substrate assembly according to claim 1, wherein:
    one of the connector and the substrate has an engagement portion, and the other of the connector and the substrate has a portion to be engaged, and the engagement portion and the portion to be engaged are configured to position the connector at the mounting position and the preparation position.

8. The electrical connector•substrate assembly according to claim 1, wherein:
the substrate has a guide groove which guides a frame body of the connector.

9. The electrical connector•substrate assembly according to claim 1, wherein:
the connector has a screw mount,
the substrate comprises:
 a screw hole at a position corresponding to the screw mount when the connector is located at the mounting position; and
 a nut which is coaxial with the screw hole and fixed to a surface opposite to an abutment surface of the screw mount, and
the connector and the substrate are fixed to each other by screwing of the screw into the nut through the screw mount and the screw hole.

10. An electronic device comprising:
a first connector hole in a side surface of a chassis;
a first electrical connector which partially enters the first connector hole; and
a substrate on which the first connector is mounted, wherein:
the first connector is supported so as to be slidable with respect to the substrate, from a preparation position to a mounting position,
the first connector partially projects outwardly, from an end portion of the substrate, at least at the mounting position, and
the first connector is fixed at the mounting position, and the first connector, at the preparation position, slides outwardly from the end portion of the substrate to the mounting position.

11. The electronic device according to claim 10, wherein:
the substrate has the first connector on only a first side of both sides facing each other and has a second electrical connector on a second side of the both sides,
the first connector hole is in a first side surface of the chassis and a second connector hole is in a second side surface of the chassis, and
the second connector enters the second connector hole.

12. The electronic device according to claim 11, wherein:
a number of first connectors on the first side is smaller than a number of second connectors on the second side.

13. A method for assembling an electronic device having:
a chassis;
a connector hole in a side surface of the chassis;
an electrical connector which partially enters the connector hole; and
a substrate on which the connector is mounted and which is attached to the chassis, the method comprising:
a step of supporting the connector at a preparation position in the substrate;
a step of attaching the substrate on which the connector is supported at the preparation position to the chassis; and
a step of sliding the connector from the preparation position to a mounting position where the connector partially projects outwardly from an end portion of the substrate and partially enters the connector hole, wherein
the connector, at the preparation position, slides outwardly from the end portion of the substrate to the mounting position.

* * * * *